(12) United States Patent
Herman et al.

(10) Patent No.: US 8,929,066 B2
(45) Date of Patent: Jan. 6, 2015

(54) CHASSIS WITH SEPARATE THERMAL CHAMBER FOR SOLID STATE MEMORY

(75) Inventors: Pinchas Herman, Sunnyvale, CA (US); Radoslav Danilak, Cupertino, CA (US)

(73) Assignee: Skyera, Inc., San Jose, CA (US)

( * ) Notice: Subject to any disclaimer, the term of this patent is extended or adjusted under 35 U.S.C. 154(b) by 310 days.

(21) Appl. No.: 13/597,110

(22) Filed: Aug. 28, 2012

(65) Prior Publication Data

US 2014/0063721 A1  Mar. 6, 2014

(51) Int. Cl.
*H05K 7/20* (2006.01)

(52) U.S. Cl.
USPC .............. 361/679.46; 361/679.47; 361/679.5; 361/679.51; 361/694; 361/695; 165/80.3; 454/184

(58) Field of Classification Search
None
See application file for complete search history.

(56) References Cited

U.S. PATENT DOCUMENTS

| | | | |
|---|---|---|---|
| 7,050,301 B2* | 5/2006 | Wong et al. | 361/695 |
| 7,126,820 B2* | 10/2006 | Wei | 361/695 |
| 7,345,873 B2* | 3/2008 | Dey et al. | 361/695 |
| 7,403,385 B2* | 7/2008 | Boone et al. | 361/692 |
| 7,593,225 B2* | 9/2009 | Sasagawa et al. | 361/695 |
| 7,848,101 B2* | 12/2010 | Dey et al. | 361/679.51 |
| 8,040,683 B2 | 10/2011 | Karabatsos | |
| 8,234,459 B2 | 7/2012 | Gaither et al. | |
| 8,514,571 B2* | 8/2013 | Ji et al. | 361/693 |
| 8,514,584 B2 | 8/2013 | Liang et al. | |
| 2004/0003069 A1 | 1/2004 | Wong | |
| 2008/0002362 A1* | 1/2008 | Ishimine | 361/695 |
| 2008/0080152 A1 | 4/2008 | Duppong et al. | |
| 2010/0332733 A1 | 12/2010 | Suzuki | |
| 2013/0100627 A1 | 4/2013 | Cong et al. | |
| 2013/0183913 A1 | 7/2013 | Tevell et al. | |

OTHER PUBLICATIONS

Non-Final Office for U.S. Appl. No. 13/596,979 mailed on Jul. 15, 2014, 8 pages.
Notice of Allowance for U.S. Appl. No. 13/597,051 mailed on May 22, 2014, 11 pages.

* cited by examiner

*Primary Examiner* — Boris Chervinsky
(74) *Attorney, Agent, or Firm* — Kilpatrick Townsend & Stockton LLP

(57) ABSTRACT

A chassis for a network storage system contains a first thermal chamber that houses conventional electronic components and a second thermal chamber that houses non-volatile solid state memory such as flash memory. A cooling system keeps the electronics in first thermal chamber below their maximum junction temperature. Meanwhile, a temperature regulating system maintains the solid state memory in the second thermal chamber within a range of a preferred operating temperature selected to extend the lifetime and/or improve the reliability of the solid state memory. Thus, the chassis provides dual zone temperature control to improve performance of the network storage system.

16 Claims, 5 Drawing Sheets

CHASSIS WITH SEPARATE THERMAL CHAMBER FOR SOLID STATE MEMORY

RELATED APPLICATIONS

This application is related to U.S. application Ser. No. 13/597,051 entitled "Motherboard with Card Guide Cutouts" to Pinchas Herman, et al. filed on Aug. 28, 2012, and to U.S. application Ser. No. 13/596,979 entitled "Integrated Storage and Switching for Memory Systems" to Radoslav Danilak filed on Aug. 28, 2012, the contents of which are each incorporated by reference herein.

BACKGROUND

1. Field of the Invention

The invention relates generally to a chassis for a network storage system and more particularly to temperature control within a chassis.

2. Description of the Related Arts

Prices for non-volatile solid state memory such as flash memory have been steadily decreasing while their capacities have been increasing. As a result, solid state drives (SSDs) are becoming an increasingly viable alternative to hard disk drives for storing large quantities of data. Apart from the economic factors, SSDs have several properties that make them preferable over hard disk drives, including reduced power consumption, lower heat generation, faster read/write times, and significantly quieter operation. However, a significant drawback to solid state drives is that they have a finite number of read/write cycles before failure.

SUMMARY

A chassis contains a first thermal chamber that houses conventional electronic components and a second thermal chamber that houses solid state memory. A cooling system keeps the electronics in first thermal chamber below their maximum junction temperature. Meanwhile, a temperature regulating system maintains the solid state memory in the second thermal chamber within a range of a preferred operating temperature (e.g., 15° C., 25° C., 40° C., 70° C., 85° C.), thus extending the lifetime of the solid state memory. In some embodiments, the temperature regulating system may include a heating device that actively raises the temperature of the solid state memory to the preferred operating temperature. The chambers are thermally isolated from each other so that the temperature regulating system and the cooling system can maintain the two chambers at different temperatures.

The features and advantages described in the specification are not all inclusive and, in particular, many additional features and advantages will be apparent to one of ordinary skill in the art in view of the drawings, specification, and claims. Moreover, it should be noted that the language used in the specification has been principally selected for readability and instructional purposes, and may not have been selected to delineate or circumscribe the inventive subject matter.

BRIEF DESCRIPTION OF THE DRAWINGS

The teachings of the embodiments described herein can be readily understood by considering the following detailed description in conjunction with the accompanying drawings.

DETAILED DESCRIPTION OF EMBODIMENTS

Figure 1:
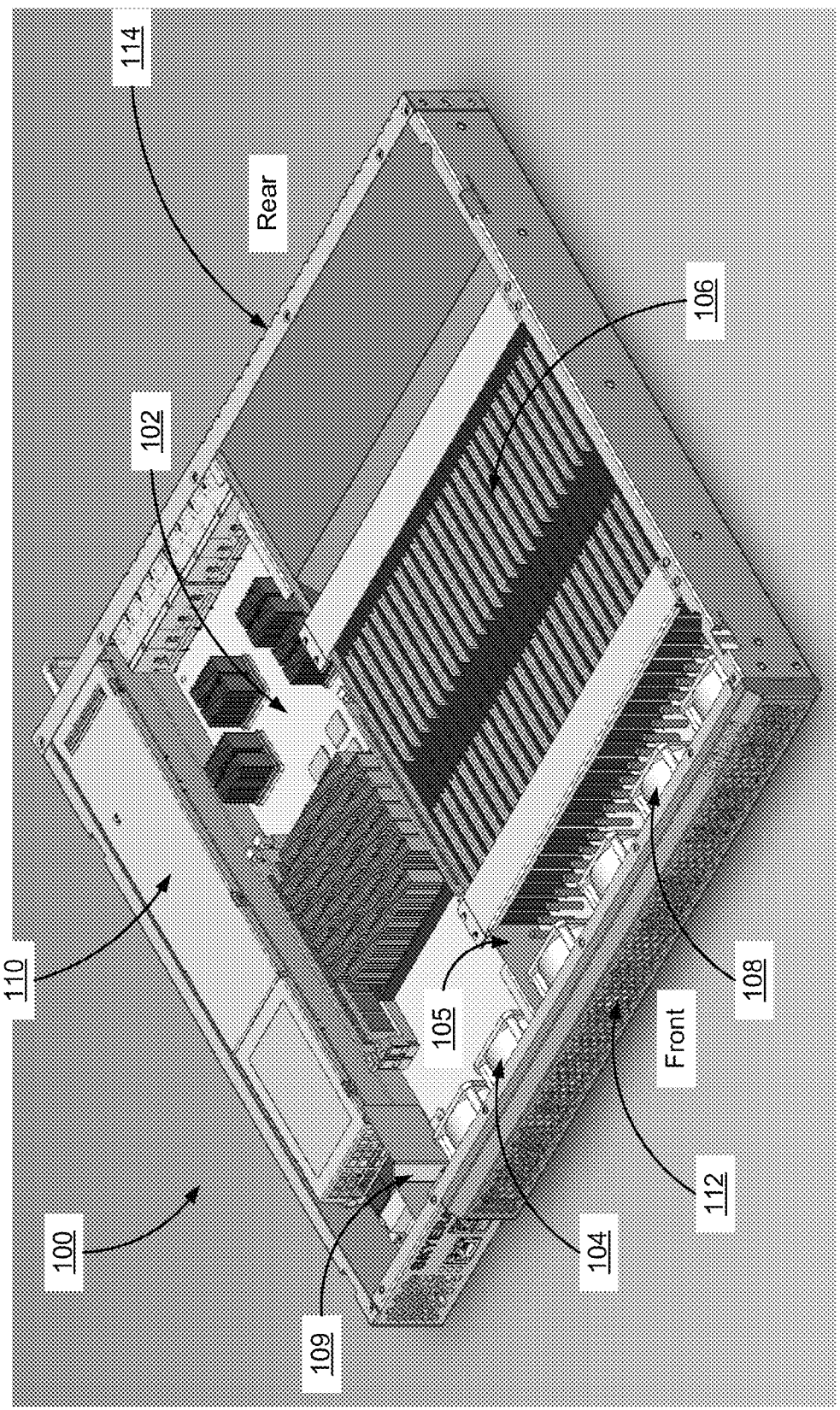
FIG. 1 is a perspective view of a storage system housed in a chassis with multiple thermal chambers, according to one embodiment.

The teachings of the embodiments of the present invention can be readily understood by considering the following detailed description in conjunction with the accompanying drawings.

Reference in the specification to "one embodiment" or to "an embodiment" means that a particular feature, structure, or characteristic described in connection with the embodiments is included in at least one embodiment. The appearances of the phrase "in one embodiment" or "an embodiment" in various places in the specification are not necessarily all referring to the same embodiment.

Reference to this particular hardware is for exemplary purposes only and the scope of the invention is not limited to this particular component.

As used herein, the term "substantially" or "approximately" as applied to metrics such as length, area, volume, form factor, orientation (e.g., perpendicular or parallel), etc. means that the metric does not necessarily precisely conform to the state value, but rather the metric may vary within a reasonable range to achieve substantial conformance as will be understood to those of ordinary skill in the art.

Furthermore, the language used in the specification has been principally selected for readability and instructional purposes, and may not have been selected to delineate or circumscribe the inventive subject matter. Accordingly, the disclosure of the embodiments is intended to be illustrative, but not limiting, of the scope of the embodiments.

A chassis for a network storage system includes a first thermal chamber for housing electronic components and a second separate thermal chamber for housing non-volatile solid state memory such as flash memory. The separate thermal chambers enable the system to maintain the electronic components and the solid state memory at different temperatures. While traditional chassis are designed to dissipate heat from the internal electronics to maintain the electronics below a maximum junction temperature, the chassis described herein is instead designed to maintain the solid state memory devices within a narrow range of a preferred operating temperature. As a result, the solid state memory devices may be at a significantly different temperature than the supporting digital electronics. For example, in one embodiment, the second thermal chamber housing the solid state memory devices is maintained within 3° C. of a preferred operating temperature of, for example, 25° C. or 70° C., while the first thermal chamber is maintained below a maximum junction temperature of 125° C. As a result, the thermal chamber for the solid state memory may be significantly warmer than the supporting digital electronics when the electronics are near room temperature (e.g., when idle) and significantly cooler when the electronics are near their maximum junction temperature (e.g., at full load).

Maintaining the solid state memory in a narrower temperature range (i.e., preventing large fluctuations in temperature) has been observed to significantly reduce the error bit rate of the memory, thus improving reliability. Different preferred operating temperatures may be selected to enhance the reliability and performance of solid state memory in different situations. For example, in situations where data is typically modified at a high data rate, it may be beneficial to maintain the solid state memory at a higher temperature (e.g., 70° C.) to improve reliability. In other situations, maintaining flash memory at a lower temperature (e.g., 25° C. or lower) may reduce the rate of data decay in the memory, which can be beneficial in a scenario where data in the memory is typically accessed at a high bit rate but modified at a lower bit rate. By controlling temperature appropriately, the lifetime and reliability of the solid state memory may be substantially increased. For example, the number of read/write cycles may substantially increase and the failure rate may be decreased. Thus, the described chassis enables dual zone temperature control that allows both the digital electronics and the memory devices to operate under their respective ideal temperature conditions.

FIG. 1 is a perspective view of an embodiment of a storage system housed in a chassis 100 with multiple thermal chambers. A digital chamber 102 holds electronic components mounted on a motherboard (e.g., a printed circuit board). These electronic components may include, for example, one or more processors and/or controllers, random access memory (RAM), and a network interface device. Some of the components (e.g., a processor or other high power components) may be positioned under heat sinks that help dissipate the heat generated by these components.

The temperatures of the components in the digital chamber 102 can rise when the components are under heavy load, which can lead to failure of the devices. Thus, to prevent the electronics from overheating, a first set of fans 104 generates air flow through the digital chamber 102 to provide cooling sufficient to maintain the components below their maximum junction temperature. Electronic components typically have a maximum junction temperature of around 125° C., but some components may have a maximum junction temperature that is higher (e.g., 150° C.) or lower (e.g., 85° C., 105° C.). Generally, it is desirable to dissipate heat from these electronic components as much as possible. Thus, in a typical embodiment, the fans 104 are controlled by a fan controller that is configured to keep the temperature of the components as low as possible.

An SSD chamber 106 holds an array of flash blades mounted substantially perpendicular to the motherboard. Each flash blade may include, for example, a printed circuit board having one or more flash memory controllers and one or more solid state memory modules. A second set of fans 108 generate air flow through the SSD chamber 106 in order to maintain the temperature of the memory modules within a fixed range of a preferred operating temperature that allows for improved performance and extended lifetime. In one embodiment, temperature is controlled within the SSD chamber 106 to keep the memory modules within 3° C. of a preferred operating temperature of 70° C. (e.g, between 67° C. and 73° C.). In an alternative embodiment, the memory modules are kept at a substantially lower operating temperature, such as 25° C. or 15° C., which means the SSD chamber 106 remains substantially cooler than the electronics in the digital chamber 102. As described above, a lower operating temperature may be beneficial for a scenario where the data in the memory modules is accessed at a high bit rate but is modified at a lower bit rate. In addition, a different preferred operating temperature (e.g., 40° C., or 85° C.) or a different temperature range (e.g., within 1° C., 2° C., or 5° C. of the preferred operating temperature) may be used. As a result, the air temperature in the SSD chamber 106 is typically different from the air temperature in the digital chamber 102. To help maintain the temperature difference, an air barrier 105 separates the SSD chamber 106 and the digital chamber 102.

A power supply chamber 110 holds a power supply that provides power to the electronic components in the digital chamber 102 and to the flash blades in the SSD chamber 106. In a typical embodiment, the components in the digital chamber 102 generate more heat than the power supply, so the air in the digital chamber 102 is likely to be at a higher temperature than the air in the power supply chamber 110. To prevent the digital chamber 102 from raising the temperature of the power supply chamber 110, a second air barrier 109 may be included to separate these two chambers 102, 110.

The chassis also has a front panel 112 and a rear panel 114. The front panel 112 has a vent pattern that allows the fans 104, 108 to pull outside air into the chassis 100. Sections of the rear panel 114 may have additional vent patterns that allow moving air to exit the chassis 100. The rear panel 114 may also have a plurality of ports (e.g., Ethernet ports) to interface the storage system to one or more external devices (e.g., a network server).

As a whole, the storage system can be used for a wide range of computing tasks. However, the storage system is particularly useful as a high-speed networked storage system that provides connected computing devices with access to data stored in the memory. For example, in one embodiment, the storage system can provide 40-50 terabytes of high speed solid state memory in a single chassis 100. In the embodiment shown in FIG. 1, the storage system is housed in a chassis 100 with 1 U (one rack-unit) form factor. Thus, the chassis 100 has a substantially flat shape that allows it to be installed in a rack with other equipment (e.g., servers) that can be directly connected to the storage system to access the stored data.

Figure 2:
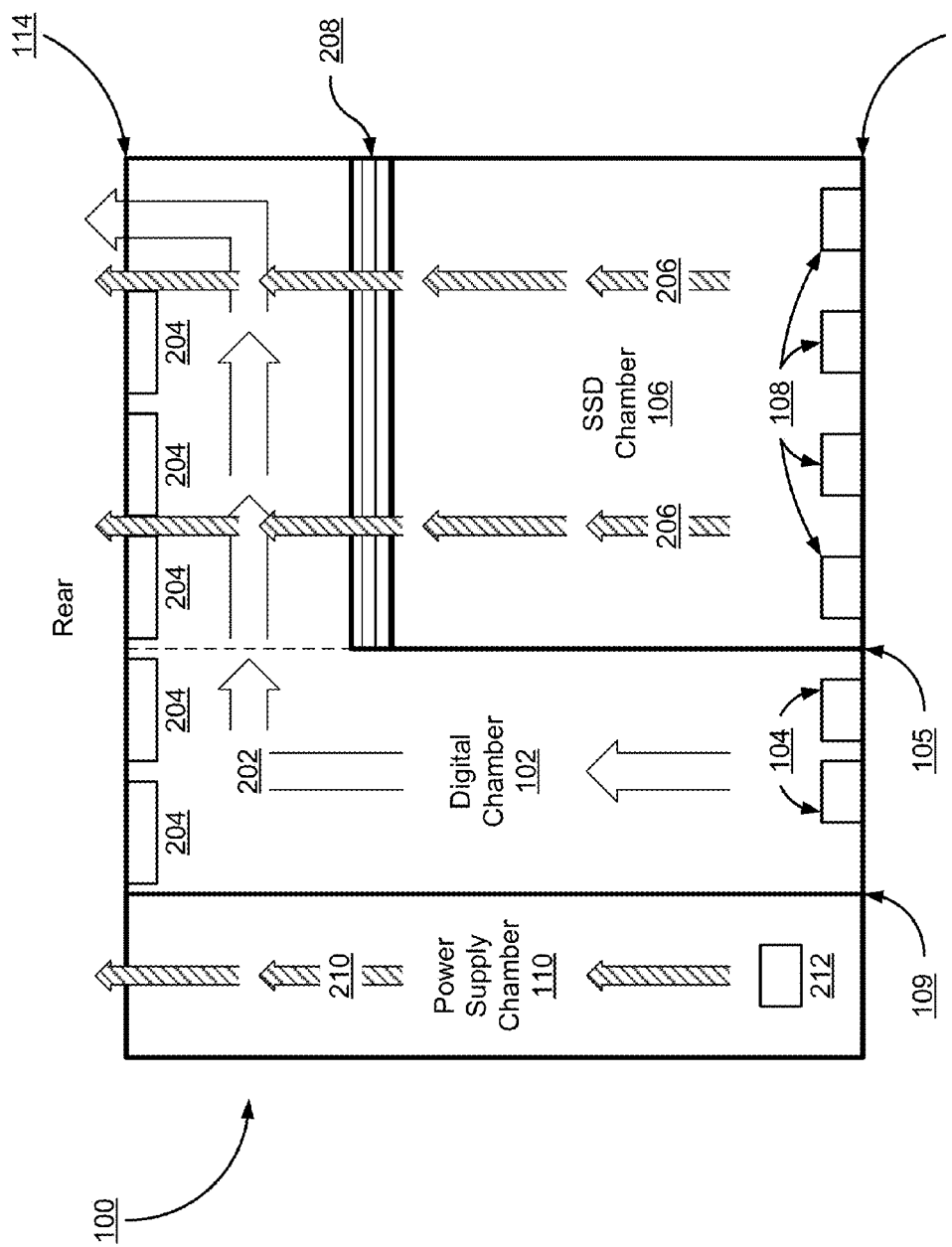
FIG. 2 is a top-down view of a chassis with multiple thermal chambers, according to one embodiment.

FIG. 2 is a top-down view of the chassis 100 of FIG. 1, according to one embodiment. The first set of fans 104 pulls air through the front panel 112 to generate airflow 202 through the digital chamber 102. In the embodiment shown in FIG. 2, the digital chamber 102 has a six-sided L shape with a narrower front section and a wider rear section. The airflow 202 passes through the front section and turns rightward to travel from left to right (when viewed from the top down) through the wider rear section as indicated by the arrows. After reaching the right side, the airflow 202 exits the chassis 100 through a vent on the far right side of the rear panel 114.

The narrower front section of the digital chamber 102 is bounded by a central portion of the front panel 112, and the first set of fans 104 is positioned to pull air into the chassis 100 through this portion of the front panel 112. The wider rear section of the digital chamber is bounded by the right portion of the rear panel 114 and accommodates several networking connectors 204 (e.g., RJ45 connectors, optical transceivers, etc.) that allow for wired connections to other computing systems. The networking connectors 204 are coupled to a network interface device in the digital chamber 102.

The L shape of the digital chamber 102 beneficially allows a large number of networking connectors 204 to be accessed through the rear panel 114. The space along the rear panel 114 can also be used for other types of external connectors (e.g., USB ports) that can be used to connect to other types of devices.

The second set of fans 108 pulls air through the right portion (when viewed from the top down) of the front panel 112 to generate airflow 206 through the SSD chamber 106. As described above with reference to FIG. 1, an air barrier 105 separates the SSD chamber 106 from the digital chamber 102 to prevent the airflow 202 in the digital chamber 102 from mixing with the airflow 206 in the SSD chamber 106. This allows the two airflows 202, 206 to be maintained at different temperatures.

An air deflector 208 is placed at the rear of the SSD chamber 106 to guide the airflow 206 over the wider rear section of the digital chamber 102. Although not visible in FIG. 2, the air deflector 208 also includes a horizontal panel that extends backward to contact with the rear panel 114 to maintain a vertical separation between the airflow 206 from the SSD chamber 106 (which in one embodiment flows on top of the horizontal panel of the air deflector 208) and the airflow 202 through the wider rear section of the digital chamber 102 (which in one embodiment flows under the horizontal panel of the air deflector 208). Thus, the air deflector 208 allows the airflow 206 to travel backward and exit through the rear panel 114 of the chassis 100 even though a portion of the digital chamber 102 is positioned between the SSD chamber 106 and the rear panel 114. A detailed description of the air deflector 208 is presented with reference to the side views shown in FIGS. 4A and 4B.

The power supply chamber 110 includes a fan 212 that pulls air through the left portion of the front panel 112 to generate airflow 210 that travels through the power supply and exits the chassis 110 through the left portion of the rear panel 114. As described above with reference to FIG. 1, another air barrier 109 separates the power supply chamber 110 and the digital chamber 102 to prevent the airflows 202, 210 through the two chambers 102, 110 from mixing. Thus, the power supply chamber 110 can be cooled to a different (e.g., lower) temperature than the digital chamber 102. By isolating heat generated in the digital chamber 102 from the power supply, the likelihood of a power supply failure is beneficially reduced.

Figure 3A:
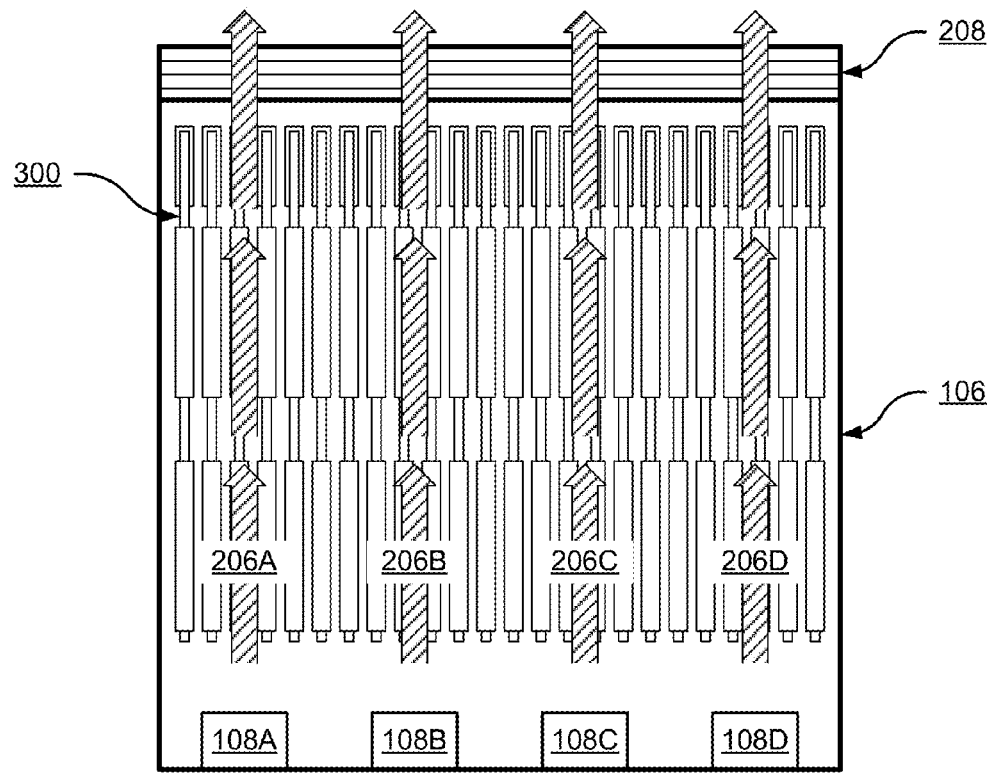
FIG. 3A is a top-down view of the thermal chamber for solid state memory, according to one embodiment.

FIG. 3A is a more detailed top-down view of the SSD chamber 106, according to one embodiment. As described above with reference to FIG. 1, the SSD chamber 106 holds an array of flash blades 300. Flash memory modules 306 are mounted to a printed circuit board 302 in each flash blade 300. The flash blades 300 are oriented parallel to the airflow 206 so that the airflow 206 passes from front to rear through the spaces between adjacent flash blades 300. After reaching the rear of the SSD chamber 106, the air deflector 208 guides the airflow 206 upward to pass over the digital chamber 102, as described with reference to FIGS. 2 and 4A.

A fan controller may be used to regulate the speed of the fans 108. In one embodiment, the fan controller also performs fault tolerance functions. For example, if the first fan 108A fails, the controller may increase the speed of the other three fans 108B-108D to compensate. Although this may result in an uneven airflow through the SSD chamber 106 (e.g., the airflow 206A on the left may be significant slower than the airflow 206B-206D in the rest of the chamber), increasing the speed of the other three fans 108B-108D can beneficially maintain the overall airflow 206 through the SSD chamber 106 at a sufficient level to maintain the flash blades 300 within their desired temperature range.

Figure 3B:
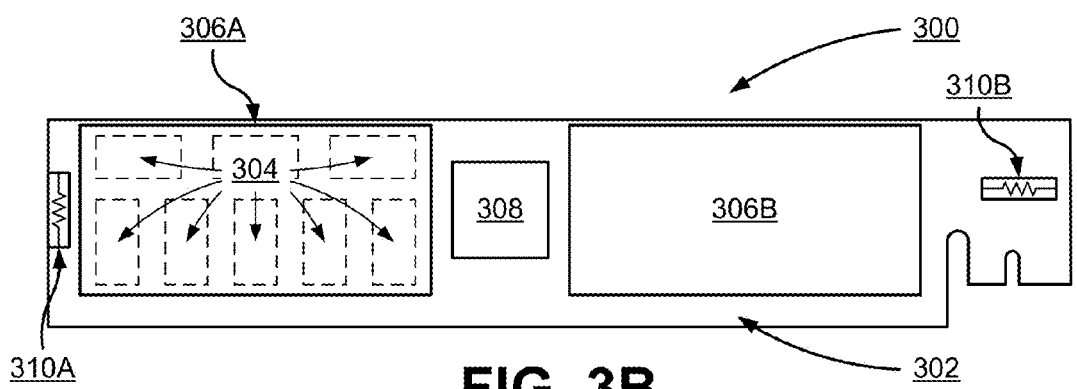
FIG. 3B is a side view of a flash blade, according to one embodiment.

FIG. 3B is a side view of a flash blade 300, according to one embodiment. The flash blade 300 comprises a printed circuit board (PCB) 302 having a plurality of mounted components. A plurality of flash memory modules 304 are mounted to the PCB 302, and the modules 304 are covered with a heat spreader 306A. The flash blade 300 shown in FIG. 3B also includes a second cluster of flash memory modules (not shown) covered with a second heat spreader 306B on the same side as the first heat spreader 306A. In some embodiments, the opposite side of the flash blade 300 may include two additional heat spreaders and flash memory clusters.

Each heat spreader 306A, 306B comprises a piece of thermally conductive material (e.g., copper, aluminum, or an alloy of multiple elements) that is thermally coupled to each flash memory module 304 in the plurality of modules. The heat spreader 306A, 306B provides a heat conduction path between the modules 304 and allows the modules 304 to be maintained at approximately the same temperature. The interior surface of the heat spreader 306A, 306B may directly contact the flash memory modules 304, or a thermal paste may be placed between the modules 304 and the internal surface to enhance the heat transfer between the modules 304 and the heat spreader 306A, 306B. The exterior surface of the heat spreader 306A, 306B may have ridges to increase the heat spreader's external surface area and improve heat transfer between the heat spreader 306A, 306B and the airflow 206.

The flash blade 300 may also include a flash controller 308 for the flash memory modules 304. The flash controller 308 manages data stored on the flash memory modules 304 (e.g., read, write, or erase operations) and transfers data between the flash memory modules 304 and electronic components in the digital chamber 102. In embodiments where the flash blade 300 contains flash memory modules on both sides, a second controller may be added to the opposite side to manage the data stored on the modules on the opposite site. Alternatively, a single controller 308 may manage the data stored on the modules on both sides of the flash blade 300.

The flash blade 300 may also include heating elements 310A, 310B. The heating elements 310A, 310B can be used to rapidly raise the temperature, if necessary, of the modules 304 to their preferred operating temperature (e.g., 25° C. or 70° C.) after the storage system is booted up. The heating elements 210A, 210B can also be used to maintain the modules 304 at their preferred operating temperature during times of low activity or when the temperature in the SSD chamber 106 otherwise drops significantly below the preferred operating temperature. In the embodiment illustrated in FIG. 3B, the heating elements 310A, 310B are resistive heaters that generate heat when an electric current is passed through them. The manner in which the heating elements 310A, 310B transfer heat to the flash memory modules 304 is described below with reference to FIG. 4A.

The flash blade 300 may also include cooling elements (not shown). The cooling elements may be used in conjunction with the fans 108 to lower the temperature of the modules 304 when the temperature of the modules 304 exceeds the preferred operating range. The cooling elements may also be used to perform cooling functions that would be difficult or impossible for the fans to perform, such as cooling the modules 304 to a temperature lower than the ambient temperature surrounding the chassis (e.g., 15° C.). In one embodiment, the cooling elements are thermoelectric cooling devices (e.g., Peltier elements) that transfer heat when an electric current is applied. Alternatively, the cooling elements may be parts of a reverse Rankine cycle (e.g., a refrigeration system) or some other active cooling system. The manner in which the cooling elements lower the temperature of the flash memory modules 304 is described below with reference to FIG. 4A.

Figure 4A:
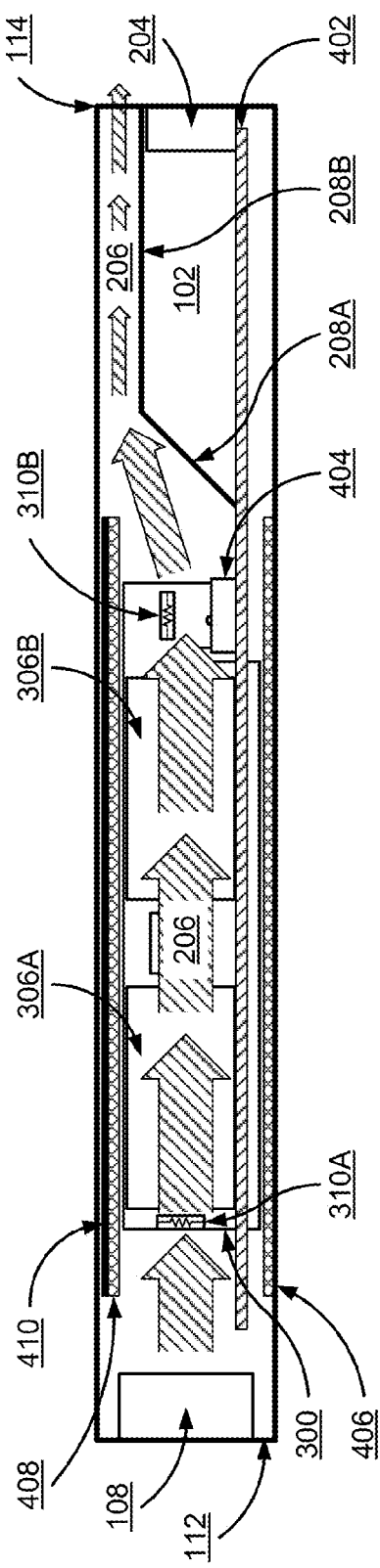
FIG. 4A is a side cut-out view of the chassis, according to one embodiment.

FIG. 4A is a side cut-out view of the chassis 100, according to one embodiment. The cut-out view illustrates a side view of the airflow 206 through SSD chamber 106. Electronic components are mounted to a motherboard 402. As known in the art, the motherboard 402 also includes traces that carry signals between the electronic components. Each flash blade 300 is held substantially upright by a connector 404 mounted on the motherboard 402, which also provides electronic connectivity between the motherboard 402 and the flash blades 300.

Since the SSD chamber 106 is typically maintained at a preferred operating temperature that may be different than the temperature of the other thermal chambers 102, 110 or the room in which the chassis 100 is kept, sheets of insulation 406, 408 may be added to the top and bottom of the SSD chamber 106 to prevent heat from escaping. In addition, the height of the flash blades 300 can be configured so that the flash blades 300 make contact with the top or bottom insulating sheets 406, 408 when installed, thus providing stability by preventing the flash blades 300 from tilting sideways.

To increase the amount of vertical space that is available inside the chassis 100, the bottom insulating sheet 406 may simply be adhered to the bottom of the chassis 100. However, the top insulating sheet 408 may be adhered to an internally mounted rigid cover 410 rather than directly to the top of the chassis 100. The rigid cover 410 remains in place when the top of the chassis 100 is removed (e.g., when a user is performing maintenance or replacing other components inside the chassis). As a result, the top insulating sheet 408 also remains in place when the top of the chassis 100 is removed, thus maintaining the stability provided by the contact between the flash blades 300 and the insulating sheets 406, 408.

To further improve the thermal isolation of the SSD chamber 106 from the rest of the chassis 100, an insulating strip (not visible in FIG. 4A) may be added in the space under the air barrier 105 (see FIGS. 1 and 2) between the bottom of the motherboard 402 and the top of the lower insulating sheet 406. The air barrier 105 may also be covered in an insulating material, but insulating the air barrier 105 is not crucial to the thermal isolation of the SSD chamber 106 because the air barrier 105 has a much smaller surface area than the top and bottom surfaces of the SSD chamber 106. In some embodiments, foam is used as the material for the insulating sheets 406, 408 and the insulating strip. However, any other insulating material may be used.

As described above with reference to FIG. 2, the second set of fans 108 pull air into the SSD chamber 106 through the front panel 112 to generate airflow 206. After entering the SSD chamber 106, the airflow 206 passes the heating element 310A on the flash blade 300. If the heating element 310A is turned on, then the temperature of the airflow 206 increases. This in turn causes the temperature of the heat spreaders 306A, 306B and the flash memory modules 304 to increase as the airflow 206 passes the heat spreaders 306A, 306B. In one embodiment, the controller for the fans also performs feedback temperature control functions by monitoring the temperature of the flash memory modules 304 (e.g., with a thermal sensor) and adjusting the fan speed, heating elements, and/or cooling elements to maintain the modules 304 at their preferred operating temperature. For example, the controller may activate the cooling elements or increase the speed of the fans when the temperature of the modules 304 exceeds their specified temperature range.

In an alternative embodiment, the heating elements 310A, 310B can be mounted in a different position along the path of the airflow 206 through the SSD chamber 106. For example, the heating elements can be mounted on the fans 108 or placed on the motherboard 402. In still another alternative embodiment, heating elements 310A, 310B can be coupled directly to the heat spreaders 306A, 306B (e.g., with thermal paste) instead of relying on the airflow 206 to transfer heat to the heat spreaders 306A, 306B. Similarly, the cooling elements can also be mounted directly on the flash blade 300, mounted in a different position along the path, or thermally coupled to the heat spreaders 306A, 306B.

After the airflow 206 passes the flash blades 300, it hits the air deflector 208, which guides the airflow 206 upward and over the portion of the digital chamber 102 that is positioned between the SSD chamber 106 and the rear panel 114. A first section 208A of the air deflector 208 is adjacent to the SSD 106 chamber and is slanted at a deflection angle that smoothly pushes the airflow 206 upward. In one embodiment, the deflection angle is 45°. A second section 208B of the air deflector 208 comprises a horizontal panel that extends from the first section 208A to the rear panel 114 to separate the portion of the digital chamber 102 below the second section 208B from the airflow 206 that passes above the horizontal section 208B, thus providing additional thermal isolation between the digital chamber 102 and the SSD chamber 106.

In one embodiment, the airflow deflector 208 is made of cardboard or similar material, which can easily be cut and folded into a suitable shape. Alternatively, the airflow deflector 208 can be made of some other solid material. As described above with reference to FIG. 2, using an airflow deflector 208 to direct the airflow 206 over the digital chamber 102 increases the portion of the digital chamber 102 that is bounded by the rear panel 114, which in turn allows additional external connectors 204 to be accessible through the rear panel 114.

Figure 4B:
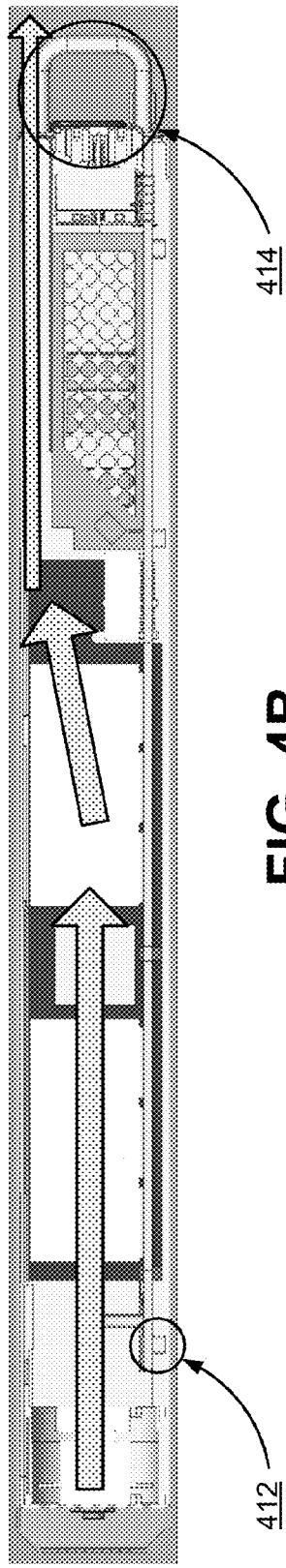
FIG. 4B is a more detailed side cut-out view of the chassis, according to one embodiment.

FIG. 4B is a more detailed side cut-out view of the chassis 100, according to one embodiment. The cut-out view shown in FIG. 4B includes some additional components that were omitted from FIG. 4A for the sake of clarity, such as standoffs 412 that support the motherboard and rack mounting hardware 414 at the rear of the chassis 100.

Embodiments of the present invention are not limited to the specific hardware elements used to create the chassis 100 in the example embodiments described above. For example, in alternative embodiments, the fans may be placed outside of their respective thermal chambers (e.g., on the exterior of the chassis). Alternatively, different components or systems may be used in conjunction with or in place of the fans to perform the cooling and temperature regulating functions of the chassis 100 (e.g., heat pipes, liquid cooling systems, etc.). The thermal chambers can also be implemented in a chassis with a form factor that is different from the 1 U rack mount form factor described herein (e.g., a tower, a desktop, an all-in-one, or a rack-mount chassis spanning multiple rack units). In addition, the underlying principles described herein may be applied to various other hardware components, including those not presently available.

The features and advantages described in the specification are not all inclusive and, in particular, many additional features and advantages will be apparent to one of ordinary skill in the art in view of the drawings and specification. Moreover, it should be noted that the language used in the specification has been principally selected for readability and instructional purposes, and may not have been selected to delineate or circumscribe the inventive subject matter.

The invention claimed is:

1. A network storage system for providing data access to a plurality of connected computing devices, the network storage system housed within a chassis, the network storage system comprising:
    a first thermal chamber within the chassis, comprising:
        a plurality of electronic components housed within the first thermal chamber, the plurality of electronic components configured to exchange data with the connected computing devices; and
        one or more heat sinks thermally coupled to the plurality of electronic components for dissipating heat generated by the plurality of electronic components;

a first set of fans for generating a first airflow within the first thermal chamber, the first airflow passing through the one or more heat sinks to transport the heat generated by the plurality of electronic components away from the plurality of electronic components and to maintain the plurality of electronic components below a first temperature;

a second thermal chamber within the chassis, the second thermal chamber being substantially thermally isolated from the first chamber, and comprising:
- a plurality of solid state storage devices communicatively coupled to the plurality of electronic components, the plurality of solid state storage devices being configured to store data accessible to the connected computing devices; and
- one or more heat spreaders, each heat spreader thermally coupled to at least one of the plurality of solid state storage devices; and a second set of fans for generating a second airflow through the second thermal chamber, the second airflow passing over the one or more heat spreaders to transport heat to and from the one or more heat spreaders such that the plurality of solid state storage devices are maintained within a fixed range of a second temperature, wherein the second temperature is higher than the first temperature.

2. The network storage system of claim 1, further comprising an airflow deflector for guiding the second airflow over a portion of the first airflow while maintaining physical isolation between the first airflow and the second airflow.

3. The network storage system of claim 1, wherein the second temperature is between 67° C. and 73° C.

4. The network storage system of claim 1, further comprising one or more heating elements in the second thermal chamber, the one or more heating elements placed within the second airflow for actively generating heat in order to raise a temperature of the solid state storage devices to within the fixed range of the second temperature.

5. The network storage system of claim 1, wherein the chassis comprises a rack-mount form factor, the chassis having a front panel and a rear panel, and wherein the first thermal chamber is bounded by a portion of the front panel and a wider portion of the rear panel, the wider portion of the rear panel exposing a plurality of connectors housed in the first thermal chamber.

6. The network storage system of claim 1, further comprising:
- a third thermal chamber comprising a power supply device; and
- a third set of fans for generating a third airflow through the third thermal chamber, the third airflow for maintaining the power supply device below a third temperature.

7. The network storage system of claim 1, further comprising a sheet of insulating material covering a side of the second thermal chamber.

8. A chassis for a storage system, the chassis comprising:
- a first thermal chamber within the chassis for housing one or more electronic components;
- a first cooling system within the chassis, the first cooling system configured to maintain the electronic components housed in the first thermal chamber below a first temperature;
- a second thermal chamber within the chassis, the second thermal chamber for housing a plurality of solid state storage devices, the second thermal chamber substantially thermally isolated from the first thermal chamber;
- an air flow deflector for isolating the airflow through the second thermal chamber from airflow through a portion of the first thermal chamber; and
- a temperature regulating system within the chassis, the temperature regulating system configured to maintain the solid state storage devices housed in the second thermal chamber within a fixed range of a second temperature.

9. The chassis of claim 8, wherein the temperature regulating system comprises one or more fans for generating an airflow through the second thermal chamber, the airflow causing air to move past the plurality of solid state storage devices and spread thermal energy through the second thermal chamber.

10. The chassis of claim 8, wherein the second temperature is between 67° C. and 73° C.

11. The chassis of claim 8, wherein the temperature regulating system comprises one or more heating elements for actively raising the temperature of the solid state storage devices when the temperature drops below the fixed range.

12. The chassis of claim 8, wherein the temperature regulating system comprises one or more cooling elements for actively cooling the temperature of the solid state storage devices to within the fixed range when the temperature rises above the fixed range, wherein the fixed range is below an ambient temperature.

13. The chassis of claim 8, wherein the chassis is of a rack-mount form factor having a front panel and a rear panel, and wherein the first thermal chamber is bounded by a portion of the front panel and a wider portion of the rear panel, the wider portion of the rear panel exposing a plurality of connectors housed in the first thermal chamber.

14. The chassis of claim 8, further comprising:
- a third thermal chamber for housing a power supply device; and
- a second cooling system configured to maintain the power supply device housed in the third thermal chamber below a third temperature.

15. The chassis of claim 8, wherein at least one side of the second thermal chamber is covered with an insulating material.

16. The chassis of claim 8, wherein the solid state storage devices are arranged into one or more clusters, and wherein the solid state storage devices in each cluster are thermally coupled to each other by a heat spreader configured to spread heat between the solid state storage devices.

* * * * *